US008694039B2

(12) United States Patent
Jalloul et al.

(10) Patent No.: US 8,694,039 B2
(45) Date of Patent: Apr. 8, 2014

(54) METHOD FOR SCANNING IN A MULTI-MODE MULTI-ANTENNA DEVICE

(75) Inventors: Louay Jalloul, Santa Clara, CA (US); Mohamed Mostafa, Santa Clara, CA (US)

(73) Assignee: Broadcom Corporation, Irvine, CA (US)

( * ) Notice: Subject to any disclaimer, the term of this patent is extended or adjusted under 35 U.S.C. 154(b) by 417 days.

(21) Appl. No.: 13/076,694

(22) Filed: Mar. 31, 2011

(65) Prior Publication Data

US 2012/0250612 A1 Oct. 4, 2012

(51) Int. Cl.
*H04B 7/00* (2006.01)
*H04B 1/40* (2006.01)
*H04B 1/18* (2006.01)
*H04M 1/00* (2006.01)

(52) U.S. Cl.
USPC ........ 455/515; 455/76; 455/552.1; 455/161.3

(58) Field of Classification Search
USPC ........ 455/434, 515, 552.1, 161.1, 161.2, 272, 455/260, 76, 161.3
See application file for complete search history.

(56) References Cited

U.S. PATENT DOCUMENTS

2009/0075611 A1* 3/2009 Wada .................... 455/160.1
2009/0081976 A1* 3/2009 Fujii et al. .................. 455/209
2010/0142504 A1* 6/2010 Bitran et al. ................ 370/338

OTHER PUBLICATIONS $3^{rd}$ Generation Partnership Project; Technical Specification Group Radio Access Network; Evolved Universal Terrestrial Radio Access (E-Utra); Requirements for support of radio resource management (Release 8) Technical Specification No. 3GPP TS 36.133, V8.0.0.0 (Dec., 2007), 21 pages.
$3^{rd}$ Generation Partnership Project; Technical Specification Group Radio Access Network; Requirements for support of radio resource management (FDD) (Release 7), Technical Specification No. 3GPP TS 25.133, V7.0.0.0 (Jun. 2005), 164 pages.
$3^{rd}$ Generation Partnership Project; Technical Specification Group Radio Access Network; Feasibility Study for Orthogonal Frequency Division Multiplexing (OFDM) for UTRAN enhancement (Release 6), Technical Specification No. 3GPP TR 25.892, V6.0.0.0 (Jun. 2004), 91 pages.

(Continued)

Primary Examiner — Nguyen Vo
(74) Attorney, Agent, or Firm — Sterne, Kessler, Goldstein & Fox P.L.L.C.

(57) ABSTRACT

A method and system are provided in which a device comprising a first or main phase locked loop (PLL) and a second or reference PLL, is operable to communicate utilizing a first and a second receiving antenna. The first PLL may generate a first signal based on a reference signal generated by the second PLL. A second signal may also be generated based on the reference signal. Data associated with a first radio access technology (RAT) may be received via the first receiving antenna utilizing the generated first signal. The first RAT or another RAT may be scanned via the second receiving antenna utilizing the generated second signal. The scan via the second receiving antenna may be performed concurrently with the reception of data via the first receiving antenna. A switch may be utilized to enable or disable scanning operations via the second receiving antenna.

20 Claims, 7 Drawing Sheets

(56) References Cited

OTHER PUBLICATIONS

3rd *Generation Partnership Project; Technical Specification Group Radio Access Network; Evolved Universal Terrestrial Radio Access (E-UTRA); User Equipment (UE) radio transmission and reception (Release 8)*, Technical Specification No. 3GPP TS 36.101, V8.0.0.0 (Dec. 2007), 45 pages.

Johnson, Chris, *Radio Access Networks for UMTS: Principles and Practice*, Wiley, ISBN No. 978-470-72405-7, Mar. 2008, entire book.

* cited by examiner

METHOD FOR SCANNING IN A MULTI-MODE MULTI-ANTENNA DEVICE

CROSS-REFERENCE TO RELATED APPLICATIONS

Incorporation by Reference

Not Applicable.

FIELD OF THE INVENTION

Certain embodiments of the invention relate to wireless communication devices. More specifically, certain embodiments of the invention relate to a method for scanning in a multi-mode multi-antenna device.

BACKGROUND OF THE INVENTION

Wireless operators and service providers continue to support legacy technologies, such as second generation (2G) wireless technologies, for example. Newer technologies, such as third generation (3G) and/or fourth generation (4G) wireless technologies, for example, are being deployed and/or developed. Accordingly, there is a need to support multiple radio access technologies (RATs) in a single device.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for scanning in a multi-mode multi-antenna device, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain embodiments of the invention can be found in a method and system for scanning in a multi-mode multi-antenna device. Various embodiments of the invention provide for a device that may comprise a first or main phase locked loop (PLL) and a second or reference PLL. The device may be operable to communicate utilizing multiple receive antennas. In some instances, the device may comprise a first and a second receiving antenna. The first PLL may generate a first signal based on a reference signal generated by the second PLL. A second signal may also be generated based on the reference signal. Data associated with a first radio access technology (RAT) may be received via the first receiving antenna utilizing the generated first signal. The first radio access technology or another radio access technology may be scanned via the second receiving antenna utilizing the generated second signal. When the first radio access technology is scanned via the second receiving antenna, the generated second signal may have a carrier frequency that is different from a carrier frequency of the generated first signal. The scan that takes place via the second receiving antenna may be performed concurrently with the reception of data via the first receiving antenna. A switch may be utilized to enable or disable scanning operations via the second receiving antenna. Moreover, the device may be operable to perform concurrent scanning over multiple receiving antennas during certain modes of operation by separating the scan frequencies into subsets and assigning the measurements associated with each subset to a different receiving antenna.

Figure 1:
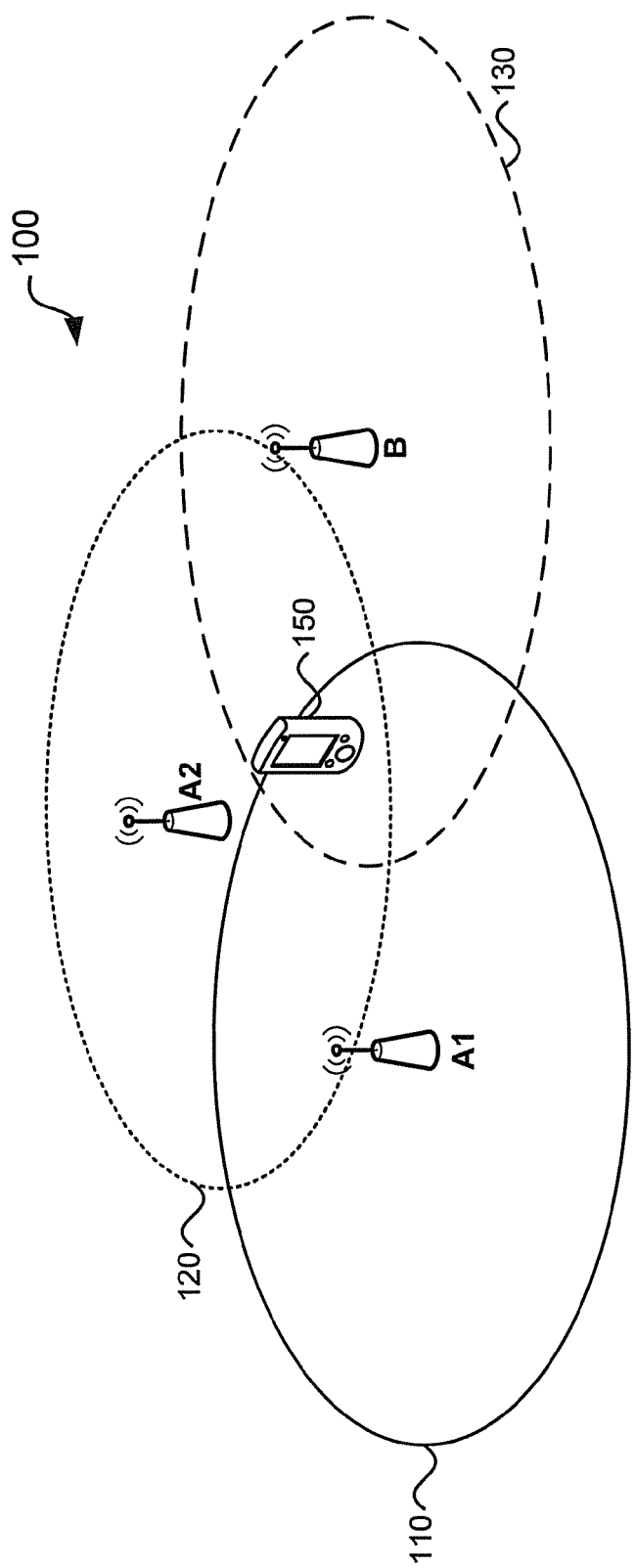
FIG. 1 is a diagram that illustrates an exemplary multi-mode multi-antenna device operating in a region with an overlay of several radio access technologies, in accordance with an embodiment of the invention.

FIG. 1 is a diagram that illustrates an exemplary multi-mode multi-antenna device operating in a region with an overlay of several radio access technologies, in accordance with an embodiment of the invention. Referring to FIG. 1, there is shown a region 100 in which portions of the region are provided with coverage from different types of radio access technologies. In this region, base stations A1 and A2 may provide network access using the same type of radio access technology, while base station B may provide network access using a type of radio access technology that is different from the one used by the base stations A1 and A2. The base station B may also refer to a base station that provides network access using the same type of radio access technology as base station A1 and A2 but with a different carrier frequency. The base station A1 may provide coverage over an area or region 110, the base station A2 may provide coverage over an area or region 120, and the base station B may provide coverage over an area or region 130. In the scenario shown in FIG. 1, the location of a mobile terminal 150 is such that it may have access to one or more networks through any one of the base stations, A1, A2, and B.

The radio access technologies that may be supported by the various base stations in region 100 include, but need not be limited to, 2G wireless technologies such as Global System for Mobile Communications (GSM), 3G wireless technologies such as Wideband Code Division Multiple Access (W-CDMA) or $3^{rd}$ Generation Partnership Project (3GPP) technologies, and 4G wireless technologies such as Long Term Evolution (LTE) and Worldwide Interoperability for Microwave Access (WiMAX). The 3GPP technologies supported may comprise those associated with, for example, Release 99 and Releases 5, 6, 7, and 8. LTE, while typically regarded as a 4G technology, is an enhancement on Universal Mobile Telecommunications System (UMTS) introduced in 3GPP Release 8. Another radio access technology, CDMA2000, which is also known as 1xRTT and is generally considered to be a "2.5G" wireless technology, may also be supported by the base stations in region 100.

Table I below shows the frequencies associated with some of the radio access technologies that may be used by the mobile terminal 150 and/or the base stations A1, A2, and B.

For example, the top portion of the table shows uplink (UL) and downlink (DL) frequency ranges in Megahertz (MHz) for LTE Evolved Universal Terrestrial Radio Access (E-UTRA). In this regard, for each of frequency bands 1-17 and 33-40 that are listed for LTE E-UTRA, the table presents the low range of the UL frequency ($F_{UL\_low}$) and the high end of the UL frequency ($F_{UL\_low}$), as well as the low range of the DL frequency ($F_{DL\_low}$) and the high end of the DL frequency ($F_{DL\_low}$). Similarly, the middle and bottom portions of the table provide the UL and the DL frequency ranges for GSM and WCDMA, respectively. For WiMAX, which is not listed in Table I, the frequency bands are typically 2.3-2.4 Gigahertz (GHz), 2.5-2.7 GHz, and 3.3-3.8 GHz.

TABLE 1

Frequency bands for several radio access technologies.

| LTE | Uplink (UL) $F_{UL\ low}$-$F_{UL\ high}$ | Downlink (DL) $F_{DL\ low}$-$F_{DL\ high}$ |
|---|---|---|
| 1 | 1920-1980 | 2110-2170 |
| 2 | 1850-1910 | 1930-1990 |
| 3 | 1710-1785 | 1805-1880 |
| 4 | 1710-1755 | 2110-2155 |
| 5 | 824-849 | 869-894 |
| 6 | 830-840 | 875-885 |
| 7 | 2500-2570 | 2620-2690 |
| 8 | 880-915 | 925-960z |
| 9 | 1749.9-1784.9 | 1844.9-1879.9 |
| 10 | 1710-1770 | 2110-2170 |
| 11 | 1427.9-1452.9 | 1475.9-1500.9 |
| 12 | [TBD]-[TBD] | [TBD]-[TBD] |
| 13 | 777-787 | 746-756 |
| 14 | 788-798 | 758-768 |
| 17 | 704-716 | 734-746 |
| 33 | 1900-1920 | 1900-1920 |
| 34 | 2010-2025 | 2010-2025 |
| 35 | 1850-1910 | 1850-1910 |
| 36 | 1930-1990 | 1930-1990 |
| 37 | 1910-1930 | 1910-1930 |
| 38 | 2570-2620 | 2570-2620 |
| 39 | 1880-1920 | 1880-1920 |
| 40 | 2300-2400 | 2300-2400 |
| 2G (GSM) | 869-894 | 824-849 |
|  | 925-960 | 880-915 |
|  | 1805-1880 | 1710-1785 |
|  | 1930-1190 | 1850-1910 |
| 3G (WCDMA) | 2110-2170 | 1920-1980 |
|  | 1930-1990 | 1850-1910 |
|  | 1805-1880 | 1710-1785 |
|  | 2110-2155 | 1710-1755 |
|  | 869-894 | 824-849 |
|  | 875-885 | 830-840 |
|  | 925-960 | 880-915 |
|  | 1844.9 1879.9 | 1749.9-1784.9 |
|  | 2110-2170 | 1710-1770 |
|  | 1475.9-1500.9 | 1427.9-1452.9 |

The mobile terminal 150 may be a multi-mode multi-antenna device that is operable to communicate with any one of the base stations in region 100. The mobile terminal 150 may be operable to communicate using two or more radio access technologies and multiple antennas. In this regard, the mobile terminal 150 may support Multiple-Input Multiple-Output (MIMO) communication techniques to increase communication performance. In MIMO communication, for example, increased performance may be achieved by utilizing two or more transmit antennas at the base station and two or more receive antennas at the mobile terminal 150. The mobile terminal 150 may also support other smart antenna techniques in which at least two receive antennas are used for communication.

The mobile terminal 150 may operate in one of multiple modes. For example, the mobile terminal 150 may operate in a Radio Resource Control (RRC) Idle mode in which no connection exits between the mobile terminal 150 and the networks that may be accessed through the base stations A1, A2, and B. While there is no active connection in this mode, the mobile terminal 150 may be scanning multiple carrier frequencies and/or multiple radio access technologies available in region 100. Another mode may be a connected mode, which as the name indicates is the operating mode when the mobile terminal 150 is connected to a network or when transitioning between network connections. Another mode is a power-up and network entry mode, wherein the terminal performs scanning which is similar to the RRC Idle mode. As with the RRC Idle mode, the power-up and network entry mode requires scanning of multiple carrier frequencies and/or multiple radio access technologies. The mobile terminal 150 may be able to prioritize the search in this mode based on a preferred network entry list.

During power-up and network entry mode, or during RRC Idle mode, for example, the mobile terminal 150 may separate the measurements that are to take place for scanning into two or more receive antennas. The receive antennas may then concurrently perform the scanning measurements. These measurements may comprise Received Signal Strength Indication (RSSI) and/or Carrier-to-Interference and Noise Ratio (CINR) measurements, for example. In this manner, each receive antenna that is being used for scanning may measure a different carrier frequency and/or radio access technology, which may significantly improve the time it takes to detect, select, and establish a network connection. The mobile terminal 150 may use frequency information, such as that shown in Table I, to determine how to separate the scanning measurements among the receive antennas and/or to determine the order in which to scanning measurements are to be made. As noted above, the search or scanning measurements may be divided or separated over a plurality of receive antennas while the mobile terminal 150 is in a power-up and network entry mode or during RRC Idle mode. In this manner, each receive antenna may search or scan a particular subset of carrier frequencies concurrently with the search or scan being done by the other receive antennas to reduce the amount of time it takes to carry out the scan.

Once connected to a network through one of the base stations, the mobile terminal 150 may be required by the network, or by an autonomous process executing in the mobile terminal 150, to be handed off to another base station. The handoff may be prompted by changes in, for example, signal quality including signal strength, type of service, and/or coverage. The handoff may be performed based on search information resulting from scanning measurements carried out by the mobile terminal 150 during the connected mode. The scanning may comprise the scanning of other base stations in the area that support the same radio access technology and the same carrier frequency as the current base station. The scanning may also comprise the scanning of other base stations in the area that support the same radio access technology but a different carrier frequency than the current base station. The scanning may also comprise the scanning of other base stations in the area that support a different radio access technology and a different frequency than the current base station.

During RRC Connected mode scanning, the mobile terminal 150 may be operable to use one or more receive antennas to maintain the existing network connection with its current base station. Concurrently, the mobile terminal 150 may use one or more of its remaining receive antennas to scan for other carrier frequencies and/or other radio access technologies available from other base stations in the area. In this manner, the scanning operation may be carried out more efficiently than when using conventional scanning methods.

For example, in the various 3GPP standards, a base station may schedule a typical terminal to be in compressed mode such that the data that is to be transmitted in one frame is compressed to a portion of the frame and the other portion of the frame can be used for scanning. In a 10 milliseconds (ms) frame, for example, as much as half the frame or 5 ms may be used for scanning. In LTE, the base station may schedule transmission gaps of 6 ms every 40 ms to allow a typical terminal to perform scanning. Not only does scheduling a compressed mode or transmission gaps reduces the aggregate data rate of a typical terminal, but base stations are not always able to schedule these scanning measurement intervals for the typical terminal. Accordingly, the approach supported by the mobile terminal 150 may result in better aggregate data rates than conventional approaches.

When a handoff occurs from one radio access technology to another in the connected mode, the transition may be seamless or not. A seamless transition occurs without any loss of data, while for a transition that is not seamless a connection has to be terminated with the current base station before a new connection can be established with another base station. Handoffs may also require that the transition be from one carrier frequency to another and/or from one radio access technology to another. Handoffs from, for example, LTE and 2G/3G wireless technologies to 1XRTT can be made seamless as those transitions are typically well defined in the corresponding 3GPP standards. On the other hand, transitions from LTE and 2G/3G wireless technologies to WiMAX, or from 1xRTT to WiMAX, are not generally be seamless. The ability of the mobile terminal 150 to maintain a connection with a current radio access technology while scanning for a different radio access technology may enable seamless handoffs in those instances in which it may not have been previously possible and may enable more effective transitions to occur in those instances in which seamless handoffs may take place.

Referring back to the exemplary scenario shown in FIG. 1, in operation, the mobile terminal 150 may first operate in power-up and network entry mode, or in idle mode, and may separately and concurrently perform scanning of the multiple carrier frequencies and/or radio access technologies in region 100 through two or more receive antennas. In this scenario, the mobile terminal 150 may establish an initial network connection with base station A1 through a first radio access technology using a first carrier frequency.

Once in the connected mode, a handoff operation may be started in the mobile terminal 150, either by a network request or as a result of a process in the mobile terminal 150. While still connected to base station A1 through one or more of its receive antennas, the mobile terminal 150 may begin scanning signals provided by base stations A2 and B through one or more of its remaining receive antennas. Base station A2 may provide access with the same radio access technology as base station A1, but using a second carrier frequency. Base station B may provide access with a second radio access technology using a third carrier frequency. The mobile terminal 150 may scan and analyze the signals received from the base stations A2 and B for handoff determination without the need to operate in a compressed mode or to enable transmission gaps. Once one of the base stations A2 and B is selected, a new network connection may be established between the mobile terminal 150 and the selected base station, and the connection with base station A1 terminated.

Figure 2:
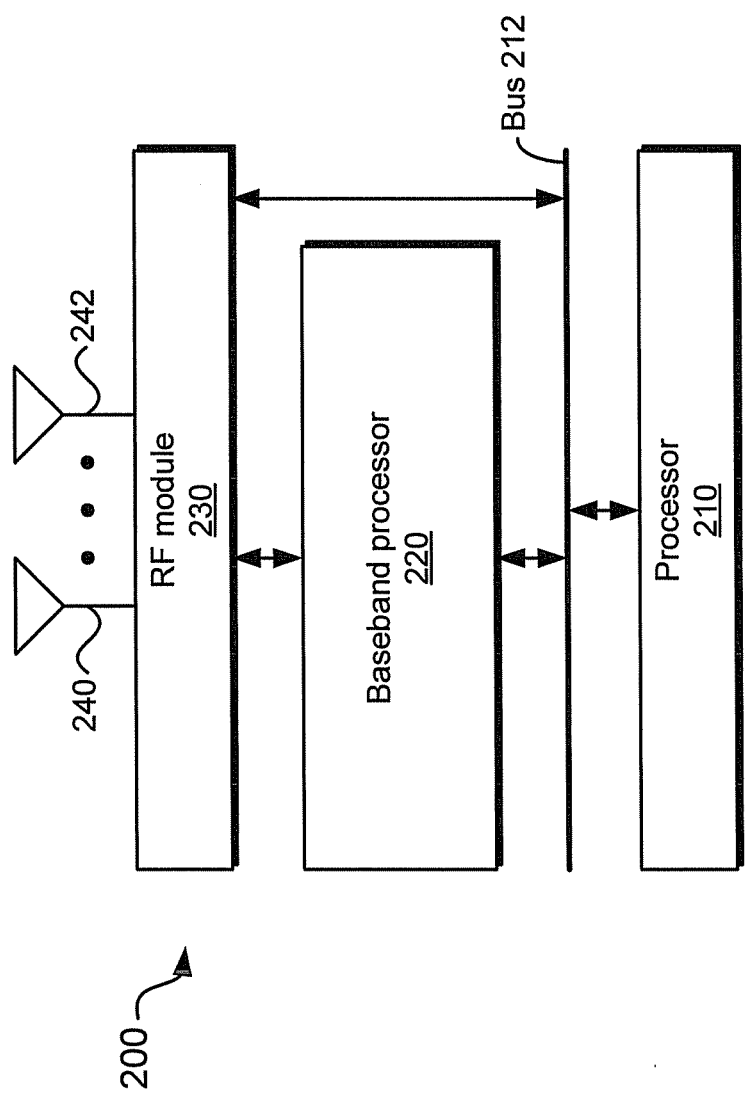
FIG. 2 is a block diagram that illustrates an exemplary multi-mode multi-antenna device architecture, in accordance with an embodiment of the invention.

FIG. 2 is a block diagram that illustrates an exemplary multi-mode multi-antenna device architecture, in accordance with an embodiment of the invention. Referring to FIG. 2, there is shown a multi-mode multi-antenna device 200 that may comprise a processor 210, a baseband processor 220, a radio frequency (RF) module 230, and antennas 240, ..., 242. Also shown is a bus 212 that may be operable to communicate data and/or control information between the processor 210, the baseband processor 220, and/or the RF module 230. The bus 212 may be operable to communicate with another component of a mobile terminal to transfer data and/or control information. The architecture of the multi-mode multi-antenna device 200 may be used to implement the mobile terminal 150 described above with respect to FIG. 1.

The processor 210 may comprise suitable logic, circuitry, code, and/or interfaces that may be operable to control, configure, and/or manage the baseband processor 220 and the RF module 230. In this regard, the processor 210 may be operable to control, configure, and/or manage operations for establishing and/or maintaining network connections, including carrier frequency and/or radio access technology scanning operations. The processor 210 may comprise memory (not shown) that may be used to store control information, configuration information, measurement results, operating information, and/or selection information. The stored information may be used by the processor 210 to establish and/or maintain network connections. The processor 210, the baseband processor 220, and/or the RF module 230, may be operable to perform receive channel measurements, such as RSSI and/or CINR measurements, and related calculations, for example.

The baseband processor 220 may comprise suitable logic, circuitry, code, and/or interfaces that may be operable to process baseband information for two or more radio access technologies. For example, the baseband processor 220 may be operable to process baseband information for any two or more of GSM, CDMA2000, W-CDMA, 3GPP technologies, LTE and variations of LTE, and WiMAX. The baseband information may comprise data, networking information, protocol information, and/or other like information, and may be received through signals provided by the RF module 230, the processor 210, and/or through the bus 312. The baseband information may be information associated with scanning operations, for example. The baseband processor 220 may be operable to detect and/or track frame and/or packet errors, for example.

The antennas 240, ..., 242, may comprise two or more transmit antennas for RF signal transmission and two or more receive antennas for RF signal reception. Accordingly, the multi-mode multi-antenna device 200 may be operable to support MIMO communication and/or any other type of smart antenna technique in which two or more transmit antennas and/or two or more receive antennas are necessary.

The RF module 230 may comprise suitable logic, circuitry, code, and/or interfaces that may be operable provide up-conversion of baseband signals provided by the baseband processor 220 to RF signals for wireless transmission. The RF module 230 may also be operable to provide down-conversion of received RF signals to baseband signals that are communicated to the baseband processor 220 for further processing. Of the portion of the antennas 240, ..., 242 that is used for RF signal reception, the RF module 230 may be configurable to select some for scanning operations while the others may be used to maintain existing network connections during a connected mode. Moreover, the RF module 230 may be configurable to select some or all of the antennas 240, ..., 242 that are used for RF signal reception to perform concurrent scanning measurements when in a power-up and network entry mode or in an idle mode.

In operation, the a multi-mode multi-antenna device 200 may operate in power-up and network entry mode, or in idle mode, and may separately and concurrently perform scanning of multiple carrier frequencies and/or radio access technologies via a portion of the antennas 240, . . . , 242 that are used for RF signal reception. The scanning operations may be controlled by the processor 210 and/or the baseband processor 220, for example. In this scenario, the multi-mode multi-antenna device 200 may be operable to establish an initial network connection with a base station through a first radio access technology using a first carrier frequency.

Once in the connected mode, and based on the operating and channel conditions, the multi-mode multi-antenna device 200 may initiate or may be directed to initiate a handoff operation. While still connected to base station, the multi-mode multi-antenna device 200 may begin scanning signals provided by other base stations through one or more of the remaining antennas 240, . . . , 242 that are used for RF signal reception. In this regard, one or more receive channel chains in the RF module 230 may be configured to enable the scanning. The processor 210 and/or the baseband processor 220 may perform various operations associated with the scanning and analysis of the signals received from the other base stations for handoff determination without the need to operate in a compressed mode or to enable transmission gaps. Once one of the base stations is selected, the processor 210 and/or the baseband processor 220 may enable a new network connection to be established between the multi-mode multi-antenna device 200 and the selected base station. In addition, the processor 210 and/or the baseband processor 220 may enable the termination of the initial network connection.

Figure 3:
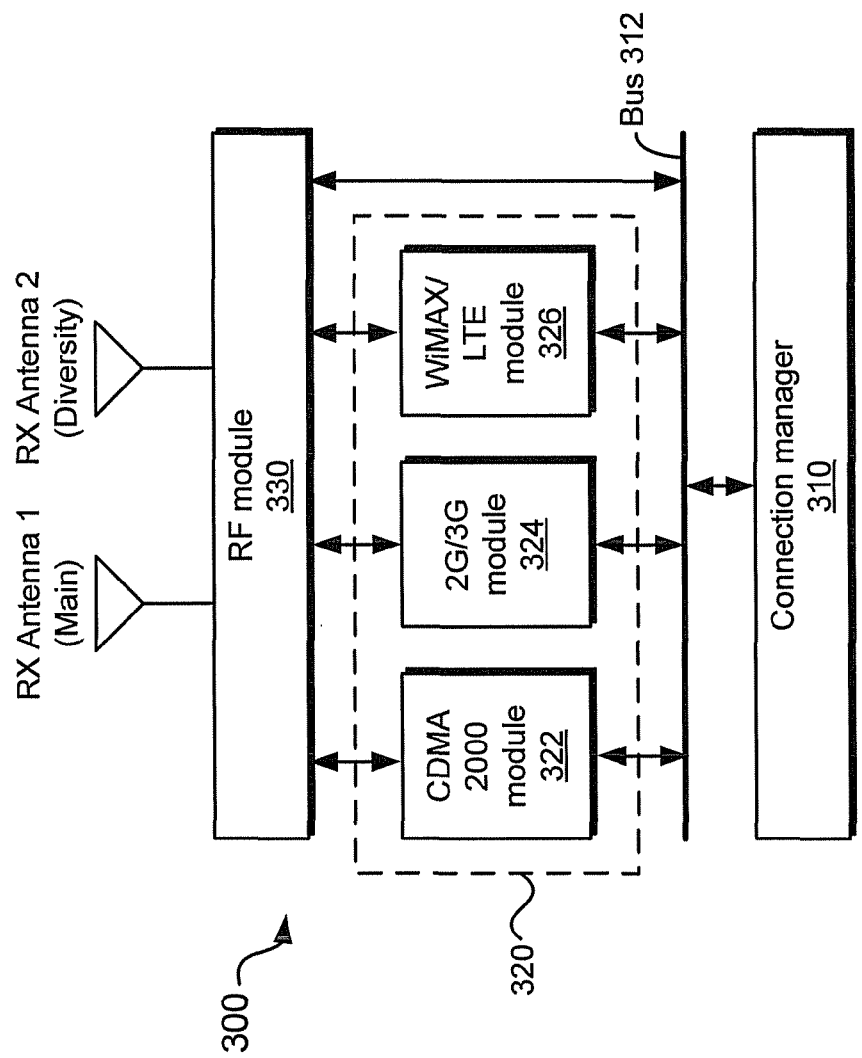
FIG. 3 is a block diagram that illustrates another exemplary multi-mode multi-antenna device architecture, in accordance with an embodiment of the invention.

FIG. 3 is a block diagram that illustrates another exemplary multi-mode multi-antenna device architecture, in accordance with an embodiment of the invention. Referring to FIG. 3, there is shown a multi-mode multi-antenna device 300 that may comprise a connection manager 310, a CDMA2000 module 322, a 2G/3G module 324, a WiMAX/LTE module 326, an RF module 330, a receive (RX) antenna 1, also referred to as a main antenna, and a RX antenna 2, also referred to as a diversity antenna. Also shown is a bus 312 that may be used to for communication between the processor 310, the CDMA2000 module 322, the 2G/3G module 324, the WiMAX/LTE module 326, and/or the RF module 330. The bus 312 may be operable to communicate with another component of a mobile terminal to transfer data and/or control information. The architecture of the multi-mode multi-antenna device 300 may be used to implement the mobile terminal 150 described above with respect to FIG. 1.

The connection manager 310 may provide substantially similar functionality as that provided by the processor 210 described above. In this regard, the connection manager 310 may be operable to control, configure, and/or manage the CDMA2000 module 322, the 2G/3G module 324, the WiMAX/LTE module 326, and the RF module 330. The connection manager 310 may be implemented as software and/or firmware operating on a microcontroller. The connection manager 310 may be implemented as software and/or firmware operating on a Reduced Instruction Set Computer (RISC).

The CDMA2000 module 322 may comprise suitable logic, circuitry, code, and/or interfaces that may be operable to process baseband information associated with CDMA2000 radio access technology. The 2G/3G module 324 may comprise suitable logic, circuitry, code, and/or interfaces that may be operable to process baseband information associated with 2G and/or 3G radio access technologies. The WiMAX/LTE module 326 may comprise suitable logic, circuitry, code, and/or interfaces that may be operable to process baseband information associated with WiMAX and/or LTE radio access technologies. Each of the modules 322, 324, and 326 may be implemented separately as shown in FIG. 3 or may be combined into a single baseband processor 320. Each of the modules 322, 324, and 326 may be operable to detect and track frame and/or packet errors, for example.

The RX Antenna 1 and the RX Antenna 2 in the multi-mode multi-antenna device 300 may be operable to support MIMO communication and/or any other type of smart antenna technique in which two or more receive antennas are necessary. Since the multi-mode multi-antenna device 300 comprises two receive antennas, it may support a 2-stream MIMO communication mode. The RX Antenna 1 and the RX Antenna 2 may be used to enable scanning operations through one antenna while maintaining an existing network connection through the other antenna during a connected mode. Moreover, the RX Antenna 1 and the RX Antenna 2 may be used to enable concurrent scanning measurements through both antennas when in a power-up and network entry mode or in an RRC Idle mode. Although not shown, the multi-mode multi-antenna device architecture 300 may comprise additional receive antennas and/or transmit antennas.

The RF module 330 may be substantially similar to the RF module 230 described above. In this regard, the RF module 330 may be operable to provide down-conversion of received RF signals to baseband signals that are communicated to one or more of the CDMA2000 module 322, the 2G/3G module 324, and the WiMAX/LTE module 326 for further processing. The RF module 230 may be operable to configure reception of RF signals through the RX Antenna 1 and the RX Antenna 2. When the multi-mode multi-antenna device architecture 300 comprises transmit antennas, the RE module 330 may be operable to provide up-conversion from baseband signals to RF signals for wireless transmission. For each of the RX Antenna 1 and the RX Antenna 2 there is an associated receive antenna chain within the RF module 330.

The connection manager 310, the baseband modules 322, 324, and 326, and/or the RF module 330, may be operable to perform channel measurements, such as RSSI and/or CINR measurements, and related calculations, for example.

Figure 4:
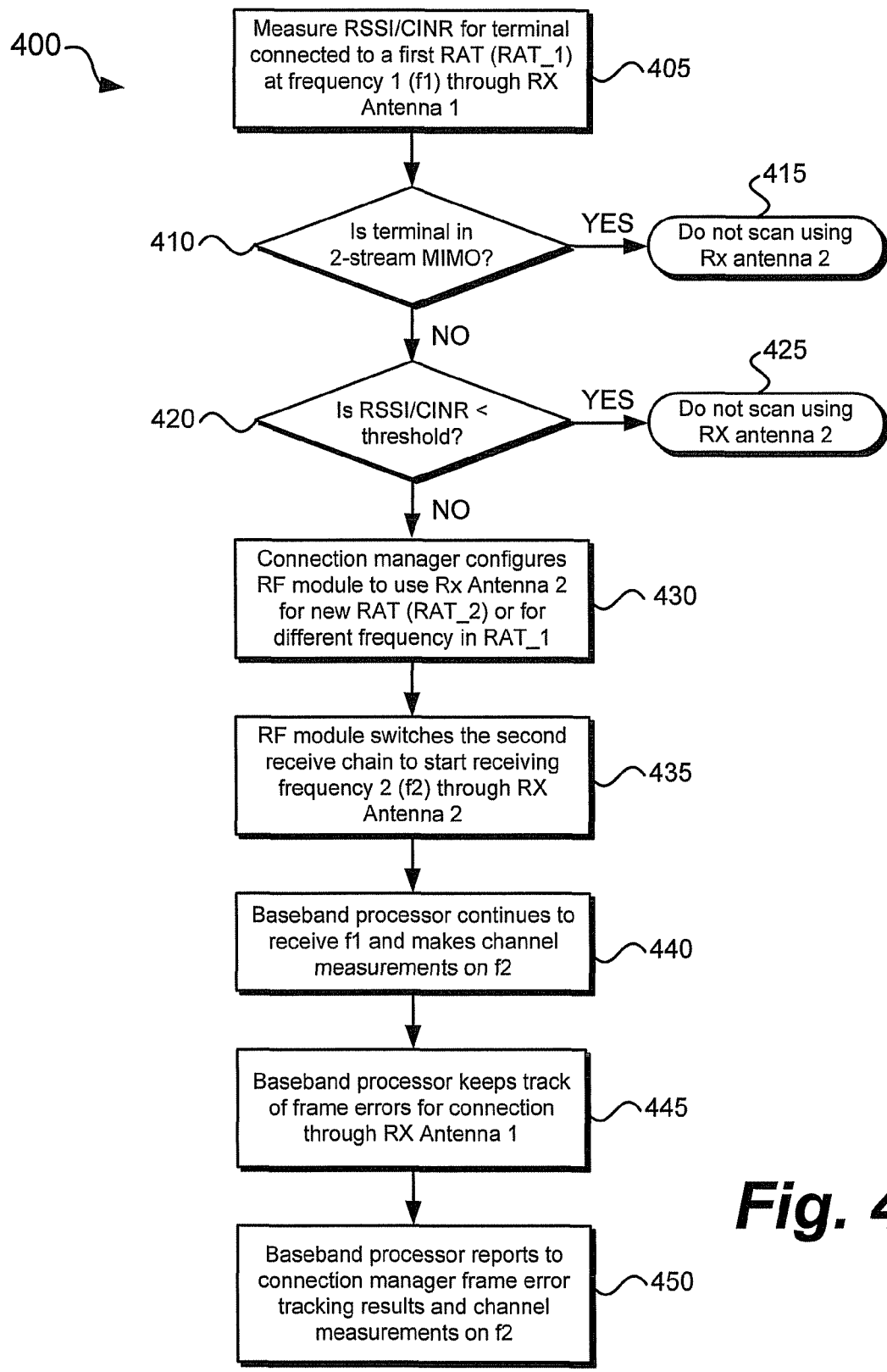
FIG. 4 is a flow chart that illustrates exemplary steps for scanning during a Radio Resource Control (RRC) Connected mode using the multi-mode multi-antenna device shown in FIG. 3, in accordance with an embodiment of the invention.

FIG. 4 is a flow chart that illustrates exemplary steps for scanning during an RRC Connected mode using the multi-mode multi-antenna device shown in FIG. 3, in accordance with an embodiment of the invention. Referring to FIG. 4, there is shown a flow chart 400 associated with a mobile terminal, such as the mobile terminal 150, for example, which may be implemented using the architecture of the multi-mode multi-antenna device 300. At step 405, the mobile terminal may measure the RSSI and/or the CINR for a network connection through the RX Antenna 1 that uses a first radio access technology (RAT_1) and a frequency 1 (f1). In this regard, the connection manager 310, the corresponding baseband module, and/or the RF module 330 may make the measurements and/or calculations of the RSSI and/or of the CINR for that connection.

At step 410, the mobile terminal may determine whether it is operating in a 2-stream MIMO communication mode. In instances when the mobile terminal may be operating in a 2-stream MIMO communication mode, the process may proceed to step 415 and the RX Antenna 2 may not be used for scanning operations. Otherwise, the process may proceed to step 420. At step 420, the mobile terminal may determine whether the RSSI and/or the CINR determined in step 405 is below a threshold value (T). The threshold value may be determined based on a prediction by the mobile terminal of the amount of data throughput degradation that the downlink may incur if the second antenna is not used for receiving signals. In some instances, for example, a five percent (5%) throughput loss may be an approximate predetermined threshold value that may be used by the mobile terminal. When the RSSI and/or CINR measurements are below the threshold value, the process may proceed to step 425 and the RX Antenna 2 may not be used for scanning operations. Otherwise, the process may proceed to step 430.

At step 430, the connection manager 310 may configure the RF module 330 to use RX Antenna 2 for a new radio access technology (RAT_2) or for a different frequency, such as a frequency 2 (f2), in the current radio access technology, RAT_1. At step 435, the RF module 330 may switch the receive antenna chain associated with RX Antenna 2 to start receiving signals using f2.

At step 440, the baseband processor 320, or the baseband module that corresponds to RAT_1, may continue to receive signals using f1. Moreover, the baseband processor 320, or the baseband module that corresponds to RAT_2, may make channel measurements on signals received through RX Antenna 2. At step 445, the baseband processor 320, or the baseband module that corresponds to RAT_1, may keep track of frame errors for the connection through RX Antenna 1. At step 450, the baseband processor, or the baseband module that corresponds to RAT_1, may report to the connection manager 310 the frame error tracking results. These results may indicate whether there is degradation in the current network connection as a result of using the RX Antenna 2 for scanning operations. Moreover, the baseband processor, or the baseband module that corresponds to RAT_2, may report to the connection manager 310 the channel measurements on f2.

The process described above with respect to FIG. 4 may also be applicable to mobile terminals that use more than two receive antennas. For example, the process may be applicable to the multi-mode multi-antenna device 200 when the number of receive antennas is two or more.

Figure 5A:
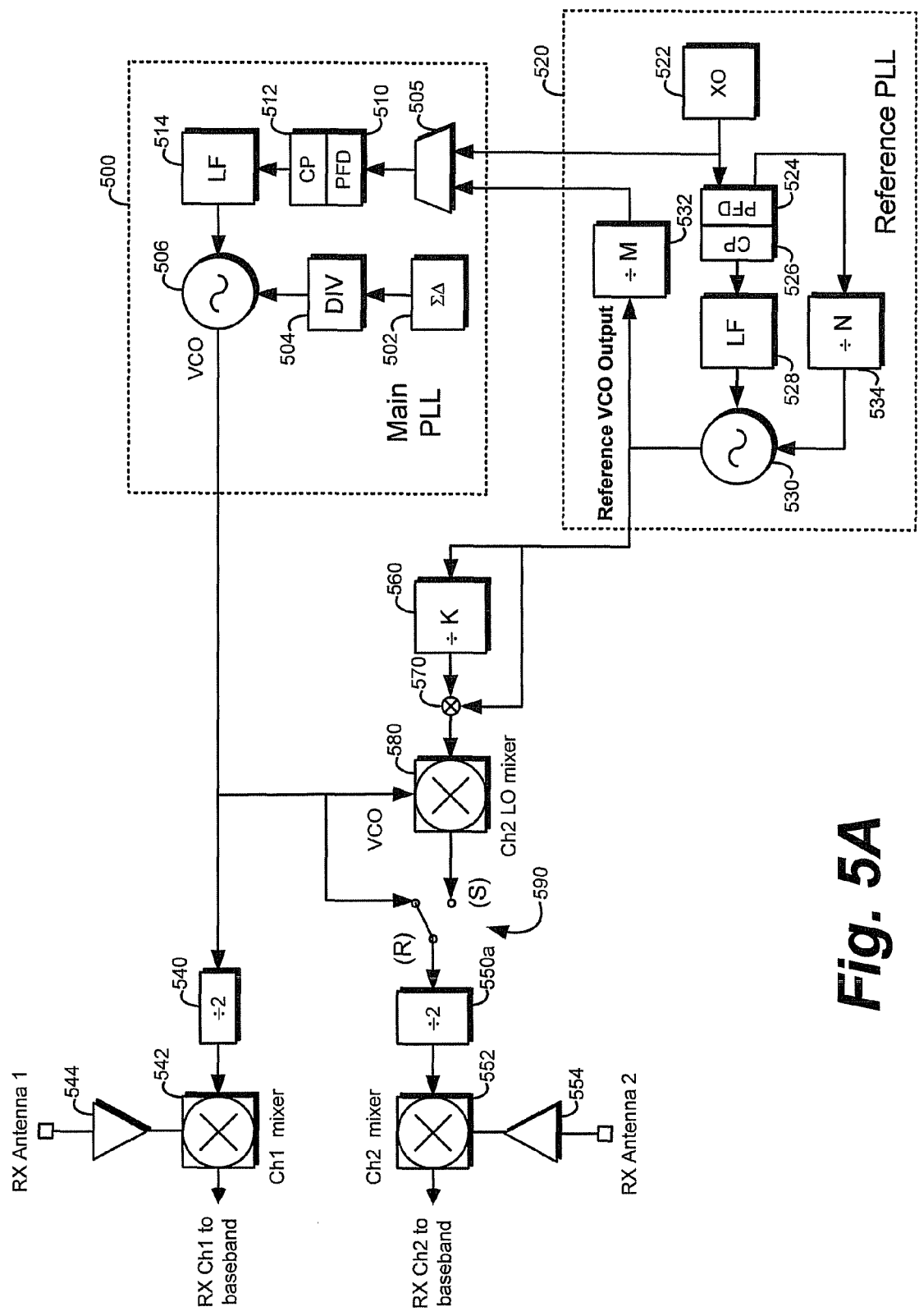
FIGS. 5A-5C are block diagrams that illustrate exemplary architectures of a radio frequency portion of a exemplary multi-mode multi-antenna device, in accordance with an embodiment of the invention.
Figure 5B:
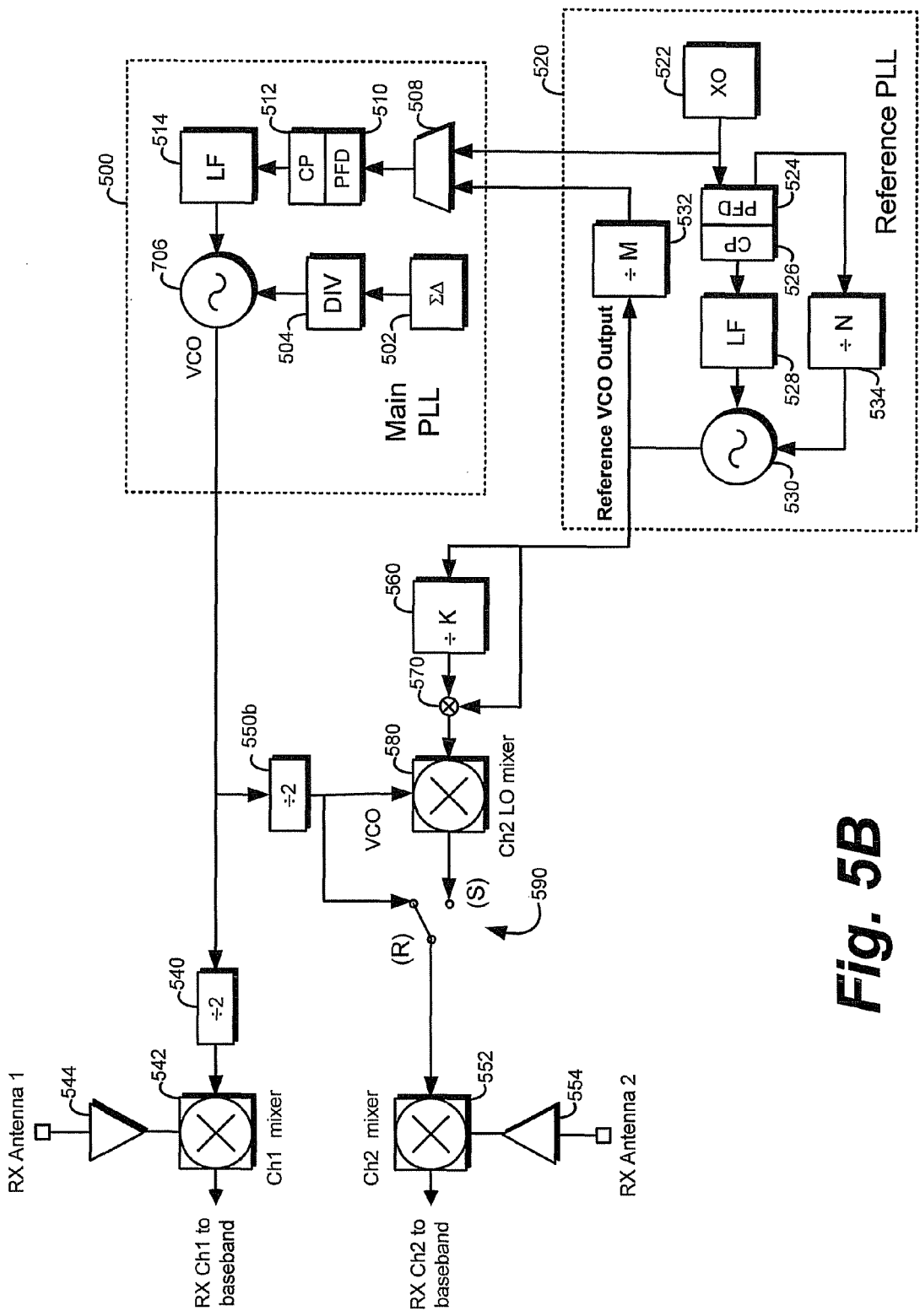
Figure 5C:
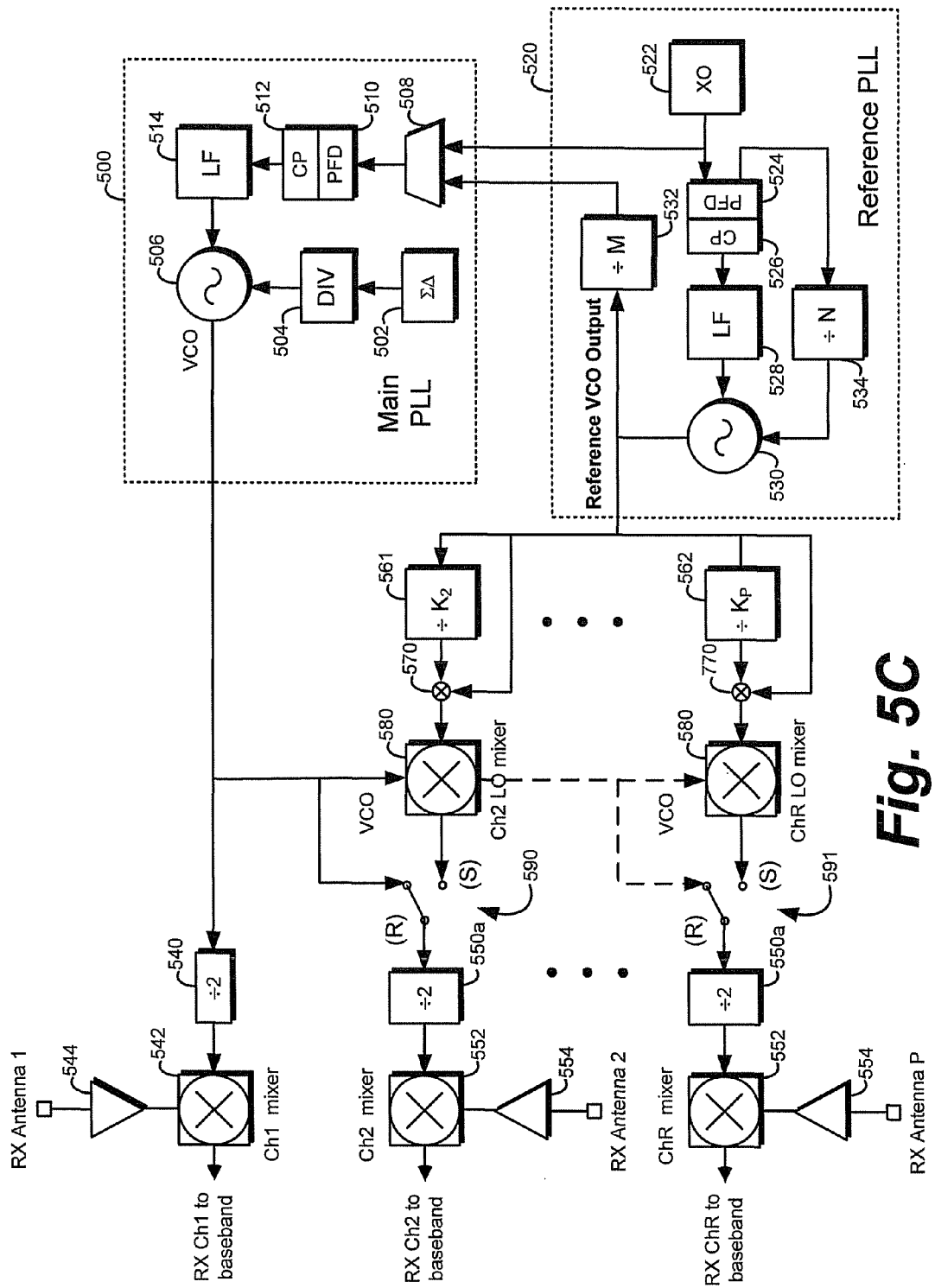

FIGS. 5A-5C are block diagrams that illustrate exemplary architectures of a radio frequency portion of an exemplary multi-mode multi-antenna device, in accordance with an embodiment of the invention. Referring to FIG. 5A, there is shown a portion of an RF module, such as the RF module 230 and 330 described above, for example, which may comprise a main phase-locked loop (PLL) 500 and a reference PLL 520. The reference PLL 520 may produce reference signals with much lower carrier frequencies than those of the output signals produced by the main PLL 500. The portion of the RF module shown in FIG. 5A enables a multi-mode multi-antenna device to receive signals associated with a first radio access technology through the RX Antenna 1 while concurrently scan other radio access technologies or other frequencies of the first radio access technology through the RX Antenna 2. The architecture shown in FIG. 5A may be used to provide accurate in-phase (I) and quadrature (Q) demodulation since no additional I, Q, and DC calibration may be needed.

The main PLL 500 may comprise a selector 505, a phase-frequency detector (PFD) 510, a charge pump (CP) 512, a loop filter (LF) 514, a delta-sigma fractional-N frequency synthesizer (ΣΔ) 502, a divider 504, and a voltage-controlled oscillator (VCO) 506. The main PLL 500 may select from two inputs provided by the reference PLL 520 and may process the selected input with the PFD 510, the CP 512, and the LF 514. The result of this process may be provided as an input to the VCO 506. The ΣΔ 502 may generate an output that is divided by the divider 504, the result of which is also provided as an input to the VCO 506.

The reference PLL 520 may be coupled to or may comprise a crystal oscillator (XO) 522. The reference PLL 520 may also comprise a PFD 524, a CP 526, a LF 528, a programmable (N) divider 534, a VCO 530, and a programmable (M) divider 532. The VCO 530 is a typical component in an RF module and generally enables a wide range of crystal oscillators to be used for generating reference signals.

The reference PLL 520 may process the output of the XO 522 with the PFD 524, the CP 526, and the LF 528. The result of this process may be provided as an input to the VCO 530. The output of the XO 522 may be one of the inputs to the main PLL 500 from the reference PLL 520. The PFD 524 may generate an output that may be divided by the N divider 534, the result of which is also provided as an input to the VCO 530. The output of the VCO 530 may be divided by the M divider 532, the result of which may be the other input to the main PLL 500 from the reference PLL 520. In another embodiment of the invention, the reference PLL 520 may be implemented using a fractional PLL for the reference loop to provide the necessary scanning frequency.

Also shown in FIG. 5A are a divider 540, a channel 1 (Ch1) mixer 542, and an amplifier 544. The divider 540 receives the output of the main PLL 500 and divides the output by two. The result is provided to the Ch1 mixer 542, which also receives the amplified signals produced by the amplifier 544 from signals received by the RX Antenna 1. The output of the Ch1 mixer 542 may comprise baseband signals that may be communicated to a baseband processor and/or to another portion of an RF module for further processing. The center or carrier frequency associated with the output of the divider 540 that is used by the Ch1 mixer 542 to produce the baseband signals may be referred to as $f_1$. The baseband signals produced by the Ch1 mixer 542 may be given by the following expression:

$$\hat{a}_1(t) = LPF\{x(t)e^{-j2\pi f_1 t}\}, \quad (1)$$

where $\hat{a}_1(t)$ is the baseband signal, $x(t)$ is the signal received through RX Antenna 1, $f_1$ is the frequency of the carrier signal generated by the divider 540, and LPF is a low-pass filtering operation that removes higher-order frequencies.

In addition, there is shown a programmable (K) divider 560, a mixer 570, a channel 2 (Ch2) local oscillator (LO) mixer 580, a switch 590, a divider 550a, a Ch2 mixer 552, and an amplifier 554. The K divider 560 and the mixer 570 process the reference VCO output from the reference PLL 520. The result is provided to the Ch2 LO mixer 580 for mixing with the output of the main PLL 500. The Ch2 LO mixer 580 may be configured to select the upper side or the lower side mixing component based on the carrier frequency used for receiving data and the carrier frequency used for scanning.

The switch 590 may select between the output of the main PLL 500 and the output of the Ch2 LO mixer, and may provide the selection to the divider 550a. The R position of the switch 590 enables a signal generated by the main PLL 500 to be used for receiving signals through RX Antenna 2. The S position of the switch 590 enables a signal generated by the Ch2 LO mixer 580 to be used for scanning signals through the RX Antenna 2. The output of the divider 550a may be provided to the Ch2 mixer 552, which also receives the amplified signals produced by the amplifier 554 from signals received by the RX Antenna 2. The output of the Ch2 mixer 552 may comprise baseband signals that may be communicated to a baseband processor and/or to another portion of an RF module for further processing. The center or carrier frequency associated with the signal produced by the divider 540 that is used by the Ch2 mixer 552 to produce the baseband signals may be referred to as $f_2$. The baseband signals produced by the Ch2 mixer 552 may be given by the following expression:

$$\hat{a}_2(t) = LPF\{x(t)e^{-j2\pi f_2 t}\}, \qquad (2)$$

where $\hat{a}_2(t)$ is the baseband signal, x(t) is the signal received through RX Antenna 2, $f_2$ is the frequency of the carrier signal generated by the divider 550a.

Referring to FIG. 5B, the portion of the RF module shown is substantially the same as that shown in FIG. 5A. In this instance, however, the divider 550a that followed the switch 590 has been removed and a divider 550b, which also provides divide-by-two functionality, has been added between the switch 590 and the main PLL 500. Therefore, the output of the divider 550b may be provided to the switch 590 and to the Ch 2 LO mixer 580. In this architecture, the reference PLL 520 may not need to generate reference signals with high carrier frequencies since the carrier frequency is no longer divided by the divider 550a. However, the I/Q accuracy in this architecture may be lower than in the architecture shown in FIG. 5A because of the trade off between I/Q accuracy and current consumption. Moreover, the architecture shown in FIG. 5B may require an additional calibration step to enable scanning through RX Antenna 2 when the switch 590 is in the S position.

Referring to FIG. 5C, the portion of the RF module shown is substantially the same as that shown in FIG. 5A. In this instance, however, additional receive antenna chains are shown for a multi-mode multi-antenna device that comprises more than two receive antennas. The architecture provides significant flexibility since the programmable dividers 561, . . . , 562 may be independently programmable by enabling the programming of each of the constants $K_2$, . . . , $K_P$ separately. Moreover, the switches 590, . . . , 591 may be independently controlled, which enables flexibility in the selection of which receive antennas that are to be used for scanning and which are to be used for receiving signals.

Another embodiment of the invention may provide for one or more processors and/or circuits, such as those described in FIGS. 2, 3, and 5A-5C, which may comprise a first PLL and a second PLL. The first PLL and the second PLL may correspond, respectively, to the main PLL 500 and the reference PLL 520 in FIGS. 5A-5C. The first PLL may comprise a delta-sigma fractional-N frequency synthesizer, such as the EA 502. The one or more processors and/or circuits may communicate utilizing a first receiving antenna and a second receiving antenna, such as the RX Antennas 1 and 2 in FIGS. 3 and 5A-5C, for example. The one or more processors and/or circuits may generate, utilizing the first PLL, a first signal based on a reference signal generated by the second PLL. The one or more processors and/or circuits may also generate a second signal based on the reference signal generated by the second PLL. The carrier frequency of the first signal may be different from the carrier frequency of the second signal.

The one or more processors and/or circuits may receive data associated with a first RAT via the first receiving antenna utilizing the generated first signal. For example, the Ch1 mixer 542 in FIGS. 5A-5C may receive data from the RX Antenna 1 and a frequency signal from the divider 540. The first RAT may be one of CDMA, WCDMA, WiMAX, and LTE, for example. Moreover, the one or more processors and/or circuits may scan the first RAT or a second RAT via the second receiving antenna utilizing the generated second signal, the scan via the second receiving antenna being performed concurrently with the reception of data via the first receiving antenna. For example, the Ch2 mixer 552 in FIGS. 5A-5C may receive data from the RX Antenna 2 and a frequency signal from the divider 550a or the divider 550b. The second RAT may be one of CDMA, WCDMA, WiMAX, and LTE, for example. The one or more processors and/or circuits may comprise a switch, such as the switch 590, for example, which may enable the scan via the second receiving antenna while also disabling the reception of data associated with the first RAT via the second receiving antenna utilizing the generated first signal. The one or more processors and/or circuits may determine, based on the data received via the first receiving antenna, frame errors associated with the first RAT, and may also determine, based on data received via the second receiving antenna, one or more signal strength indicators. The signal strength indicators may be RSSI and/or CINR measurements, for example.

When a two-stream MIMO communication mode is not being utilized, the one or more processors and/or circuits may determine whether a signal strength indicator associated with the first RAT data received via the first receiving antenna is below a threshold. When the signal strength indicator is below the threshold, the one or more processors and/or circuits may enable the scan of the first RAT or of the second RAT via the second receiving antenna utilizing the generated second signal.

The one or more processors and/or circuits may communicate utilizing a third receive antenna, such as the RX Antenna R show in FIG. 5C, for example. In such instances, the one or more processors and/or circuits may generate a third frequency signal based on the reference signal generated by the second PLL and may receive data associated with the first RAT via the third receiving antenna utilizing the generated third frequency signal. The carrier frequency of the third frequency signal may be substantially similar to the carrier frequency of the first signal. The one or more processors and/or circuits may scan the first RAT or the second RAT via the second receiving antenna utilizing the generated second signal, the scan via the second receiving antenna being performed concurrently with the reception of data via the first receiving antenna and via the third receiving antenna. The one or more processors and/or circuits comprise a switch, such as the switch 590, for example, which may disable the scan via the second receiving antenna while also enabling the reception of data associated with the first RAT via the second receiving antenna utilizing the generated first signal.

While some embodiments of the invention have been shown to use two receive antennas, the invention need not be so limited. Substantially similar embodiments may be implemented in which more than two receive or receiving antennas may be utilized.

Another embodiment of the invention may provide a non-transitory machine and/or computer readable storage and/or medium, having stored thereon, a machine code and/or a computer program having at least one code section executable by a machine and/or a computer, thereby causing the machine and/or computer to perform the steps as described herein for scanning in a multi-mode multi-antenna device.

Accordingly, the present invention may be realized in hardware, software, or a combination of hardware and software. The present invention may be realized in a centralized fashion in at least one computer system or in a distributed fashion where different elements may be spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method, comprising:
in a device that comprises a first phase locked loop (PLL) and a second PLL, and is configured to communicate utilizing a plurality of receiving antennas:
generating, by the first PLL, a first signal based on a reference signal generated by the second PLL;
generating one or more additional signals based on the reference signal generated by the second PLL;
receiving data associated with a first radio access technology via a first receiving antenna from the plurality of receiving antennas utilizing the generated first signal; and
scanning the first radio access technology or one or more additional radio access technologies via one or more remaining receiving antennas from the plurality of receiving antennas utilizing the generated one or more additional signals,
wherein the scanning via the one or more remaining receiving antennas is performed concurrently with the receiving of the data via the first receiving antenna.

2. The method of claim 1, wherein a carrier frequency of the generated first signal is different from a carrier frequency of one or more of the generated one or more additional signals.

3. The method of claim 1, wherein the first PLL comprises a delta-signal fractional-N frequency synthesizer.

4. The method of claim 1, wherein the device further comprises a switch, the method further comprising:
controlling the switch to enable the scanning via the one or more remaining receiving antennas and to disable reception of the data associated with the first radio access technology via the one or more remaining receiving antennas utilizing the generated first signal.

5. The method of claim 1, wherein each of the first radio access technology and the one or more additional radio access technologies is one of: Code Division Multiple Access (CDMA), Wideband CDMA (WCDMA), Worldwide Interoperability for Microwave Access (WiMAX), and Long Term Evolution (LTE).

6. The method of claim 1, further comprising:
determining, based on the data received via the first receiving antenna, frame errors associated with the first radio access technology; and
determining, based on scanning data received via the one or more remaining receiving antenna, one or more signal strength indicators.

7. The method of claim 1, further comprising:
when two-stream multiple-input-multiple-output (MIMO) communication is not being utilized by the device, determining whether a signal strength indicator associated with the first radio access technology data received via the first receiving antenna is below a threshold; and
when the signal strength indicator is below the threshold, enabling the scanning of the first radio access technology via the one or more remaining receiving antennas utilizing one or more of the generated one or more additional signals.

8. The method of claim 1, further comprising:
when two-stream multiple-input-multiple-output (MIMO) communication is not being utilized by the device, determining whether a signal strength indicator associated with the first radio access technology data received via the first receiving antenna is below a threshold; and
when the signal strength indicator is below the threshold, enabling the scanning of the one or more additional radio technologies via the one or more of the remaining receiving antennas utilizing one or more of the generated one or more additional signals.

9. A method, comprising:
in a device that comprises a first phase locked loop (PLL) and a second PLL, and is configured to communicate utilizing a plurality of receiving antennas:
generating, by the first PLL, a first signal based on a reference signal generated by the second PLL;
generating one or more additional signals based on the reference signal generated by the second PLL;
assigning to two or more of the plurality of receiving antennas a subset of scanning frequencies; and
concurrently scanning the subsets of scanning frequencies, wherein the subset of scanning frequencies associated with a first receiving antenna from the plurality of receiving antennas is scanned utilizing the generated first signal, and the remaining subsets of scanning frequencies are scanned utilizing one or more remaining receiving antennas from the plurality of receiving antennas and one or more of the generated one or more additional signals.

10. The method of claim 9, wherein the device is operating in a power-up and network entry mode or in a Radio Resource Control (RRC) Idle mode.

11. A system, comprising:
one or more processors and/or circuits that comprise a first phase locked loop (PLL) and a second PLL, the one or more processors and/or circuits being configured to:
generate, by the first PLL, a first signal based on a reference signal generated by the second PLL;
generate one or more additional signals based on the reference signal generated by the second PLL;
receive data associated with a first radio access technology via a first receiving antenna from the plurality of receiving antennas utilizing the generated first signal; and
scan the first radio access technology or one or more additional radio access technologies via one or more remaining receiving antennas from the plurality of receiving antennas utilizing the generated one or more additional signals, wherein the scan via the one or more remaining receiving antennas is performed concurrently with the reception of the data via the first receiving antenna.

12. The system of claim 11, wherein a carrier frequency of the generated first signal is different from a carrier frequency of one or more of the generated one or more additional signals.

13. The system of claim 11, wherein the first PLL comprises a delta-signal fractional-N frequency synthesizer.

14. The system of claim 11, wherein the one or more processors and/or circuits further comprise a switch, the one or more processors and/or circuits being further configured to:
control the switch to enable the scan via the one or more remaining receiving antennas and to disable reception of the data associated with the first radio access technology via the one or more remaining receiving antennas utilizing the generated first signal.

15. The system of claim 11, wherein each of the first radio access technology and the one or more additional radio access technologies is one of: Code Division Multiple Access (CDMA), Wideband CDMA (WCDMA), Worldwide Interoperability for Microwave Access (WiMAX), and Long Term Evolution (LTE).

16. The system of claim 11, wherein the one or more processors and/or circuits are further configured to:
determine, based on the data received via the first receiving antenna, frame errors associated with the first radio access technology; and
determine, based on scan data received via the one or more remaining receiving antenna, one or more signal strength indicators.

17. The system of claim 11, wherein the one or more processors and/or circuits are further configured to:
when two-stream multiple-input-multiple-output (MIMO) communication is not being utilized by the device, determine whether a signal strength indicator associated with the first radio access technology data received via the first receiving antenna is below a threshold; and
when the signal strength indicator is below the threshold, enable the scan of the first radio access technology via the one or more remaining receiving antennas utilizing one or more of the generated one or more additional signals.

18. The system of claim 11, wherein the one or more processors and/or circuits are further configured to:
when two-stream multiple-input-multiple-output (MIMO) communication is not being utilized by the device, determine whether a signal strength indicator associated with the first radio access technology data received via the first receiving antenna is below a threshold; and
when the signal strength indicator is below the threshold, enable the scan of the one or more additional radio technologies via the one or more remaining receiving antennas utilizing one or more of the generated one or more additional signals.

19. A system, comprising:
one or more processors and/or circuits that comprise a first phase locked loop (PLL) and a second PLL, the one or more processors and/or circuits being configured to:
generate, by the first PLL, a first signal based on a reference signal generated by the second PLL;
generate one or more additional signals based on the reference signal generated by the second PLL;
assign to two or more of the plurality of receiving antennas a subset of scanning frequencies; and
concurrently scan the subsets of scanning frequencies, wherein the subset of scanning frequencies is associated with a first receiving antenna from the plurality of receiving antennas and is scanned utilizing the generated first signal, and the remaining subsets of scanning frequencies are scanned utilizing one or more remaining receiving antennas from the plurality of receiving antennas and one or more of the generated one or more additional signals.

20. The system of claim 19, wherein the system is operating in a power-up and network entry mode or in a Radio Resource Control (RRC) Idle mode.

* * * * *